(12) United States Patent
Kato et al.

(10) Patent No.: US 9,863,993 B2
(45) Date of Patent: Jan. 9, 2018

(54) STORAGE BATTERY MONITORING DEVICE WITH WIRING DISCONNECTION DETECTION

(71) Applicant: HITACHI AUTOMOTIVE SYSTEMS, LTD., Hitachinaka-shi, Ibaraki (JP)

(72) Inventors: Shinya Kato, Hitachinaka (JP); Akihiro Machida, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 138 days.

(21) Appl. No.: 14/892,410

(22) PCT Filed: May 31, 2013

(86) PCT No.: PCT/JP2013/065189
§ 371 (c)(1),
(2) Date: Nov. 19, 2015

(87) PCT Pub. No.: WO2014/192134
PCT Pub. Date: Dec. 4, 2014

(65) Prior Publication Data
US 2016/0178684 A1 Jun. 23, 2016

(51) Int. Cl.
*G01N 27/416* (2006.01)
*H02H 1/00* (2006.01)
(Continued)

(52) U.S. Cl.
CPC .......... *G01R 31/025* (2013.01); *G01R 31/026* (2013.01); *G01R 31/362* (2013.01);
(Continued)

(58) Field of Classification Search
CPC ............ G01R 31/3627; G01R 31/3682; G01R 31/3696; G01R 31/36; G01R 31/025;
(Continued)

(56) References Cited

U.S. PATENT DOCUMENTS

2009/0051324 A1* 2/2009 Nakatsuji ............ H01M 10/441
320/134
2010/0271052 A1* 10/2010 Ishikawa .............. G01R 31/026
324/686
(Continued)

FOREIGN PATENT DOCUMENTS

DE 102011079113 A1 1/2013
EP 2043222 A2 1/2009
(Continued)

OTHER PUBLICATIONS

European Search Report for European Patent Application No. 13885679.4 dated Dec. 23, 2016.

*Primary Examiner* — Yalkew Fantu
*Assistant Examiner* — Mohammed J Sharief
(74) *Attorney, Agent, or Firm* — Volpe and Koenig, P.C.

(57) ABSTRACT

A storage battery monitoring device includes a pair of measurement lines connected respectively to a pair of voltage detection lines connected respectively to a positive and a negative electrode of a rechargeable battery, a pair of adjustment lines connected respectively to the pair of voltage detection lines in parallel with the measurement lines, a first capacitive element connected between the pair of measurement lines, a second capacitive element connected between the pair of adjustment lines, and a switch connected across the second capacitive element. Capacitance values of the first and second capacitive elements are set such that a voltage between the pair of measurement lines continues changing after closing the switch and then opening the switch after a lapse of a predetermined short-circuit time if the voltage detection line is broken.

1 Claim, 4 Drawing Sheets

(51) Int. Cl.

| | | |
|---|---|---|
| *H01H 73/00* | (2006.01) | |
| *H01G 9/18* | (2006.01) | |
| *H02J 7/00* | (2006.01) | |
| *H02M 3/06* | (2006.01) | |
| *H01G 9/00* | (2006.01) | |
| *G01R 31/02* | (2006.01) | |
| *G01R 31/36* | (2006.01) | |
| *G01R 35/00* | (2006.01) | |
| *G01R 19/165* | (2006.01) | |

(52) U.S. Cl.
CPC ........ *G01R 31/3658* (2013.01); *H02J 7/0021* (2013.01); *H02J 7/0026* (2013.01); *G01R 19/16542* (2013.01); *G01R 35/00* (2013.01)

(58) Field of Classification Search
CPC ................ G01R 31/026; G01R 31/362; G01R 31/3658; G01R 19/16542; G01R 35/00; G01R 31/028; G01R 15/14; Y02E 60/12; Y02E 60/13; H02J 7/0021; H02J 7/0026; H02J 7/0016; H02J 7/345; H02H 7/16; H02H 3/36; H02H 7/05; H02H 3/04; H02H 3/08; H01H 43/32; H01H 43/325; H01H 71/123; H01H 83/20; H01H 53/10; H01G 4/38; H01G 9/18; H01G 9/022; H01G 9/155; H01G 9/058; H01G 9/016; H01G 9/08; H01G 9/00; H01G 9/14; H01L 45/00; H02M 3/07; H02M 3/33507; H02M 3/18; H03K 3/53; H03K 3/537; Y02T 10/7022; A61N 1/375

USPC ........ 324/437; 361/117, 115, 435, 502, 522; 320/166, 167; 307/109

See application file for complete search history.

(56) References Cited

U.S. PATENT DOCUMENTS

| | | |
|---|---|---|
| 2013/0041606 A1 | 2/2013 | Tang et al. |
| 2014/0176149 A1* | 6/2014 | Mizoguchi ......... G01R 31/3658 324/434 |

FOREIGN PATENT DOCUMENTS

| | | |
|---|---|---|
| JP | 2001-157367 A | 6/2001 |
| WO | 2007/119682 A1 | 10/2007 |
| WO | 2012/164761 A1 | 12/2012 |

* cited by examiner

STORAGE BATTERY MONITORING DEVICE WITH WIRING DISCONNECTION DETECTION

TECHNICAL FIELD

The present invention relates to a storage battery monitoring device.

BACKGROUND ART

A plurality of battery cells employing secondary batteries is conventionally connected in series to form an assembled battery for the purpose of improving handling performance and simplifying the structure. If in such an assembled battery, a lithium-ion battery is used for each battery cell, a method is known in which each battery cell is connected to a voltage detection line to measure the voltage, and the state of each battery cell is detected based on the measurement result to manage the assembled battery.

In the above assembled battery management method, if connection failure occurs between the battery cell and a voltage measurement circuit due to a break in the voltage detection line or the like, the voltage across the battery cell cannot be correctly measured. Therefore, the assembled battery cannot be appropriately managed. Hence, a method for detecting connection failure as in the following PTL 1 is known as means for solving this. In this method, a short circuit is caused via a resistor between the voltage detection lines connected respectively to the positive and negative electrodes of the battery cell, for a predetermined time. The short circuit is subsequently canceled to detect whether the voltage between the voltage detection lines is approximately a short circuit voltage. Accordingly, whether or not connection failure has occurred is judged.

CITATION LIST

Patent Literature

PTL 1: Japanese Patent Application Laid-Open Publication No. 2001-157367

SUMMARY OF INVENTION

Technical Problem

Generally, a voltage detection line connected to a battery cell is connected to a noise filter for removing noise. Hence, in the method for detecting connection failure described in the above PTL 1, if a short circuit is caused between the voltage detection lines when connection failure is occurring, a discharge time is required in accordance with the time constant of the noise filter to reduce the voltage between the voltage detection lines to a voltage judged as connection failure. Therefore, there is a problem that a short-circuit time required to detect connection failure is prolonged, and a loss of power is increased by the prolonged time.

Solution to Problem

A storage battery monitoring device according to the present invention includes: a pair of measurement lines connected respectively to a pair of voltage detection lines connected respectively to a positive and a negative electrode of a rechargeable battery; a pair of adjustment lines connected respectively to the pair of voltage detection lines in parallel with the measurement lines; a first capacitive element connected between the pair of measurement lines; a second capacitive element connected between the pair of adjustment lines; and a switch connected across the second capacitive element, and capacitance values of the first and second capacitive elements are set such that a voltage between the pair of measurement lines continues changing after closing the switch and then opening the switch after a lapse of a predetermined short-circuit time upon the voltage detection line being broken.

Advantageous Effects of Invention

According to the invention, it is possible to reduce a short-circuit time required to detect connection failure, and reduce a loss of power.

DESCRIPTION OF EMBODIMENTS

An embodiment of the present invention is described hereinafter based on the drawings.

Figure 1:
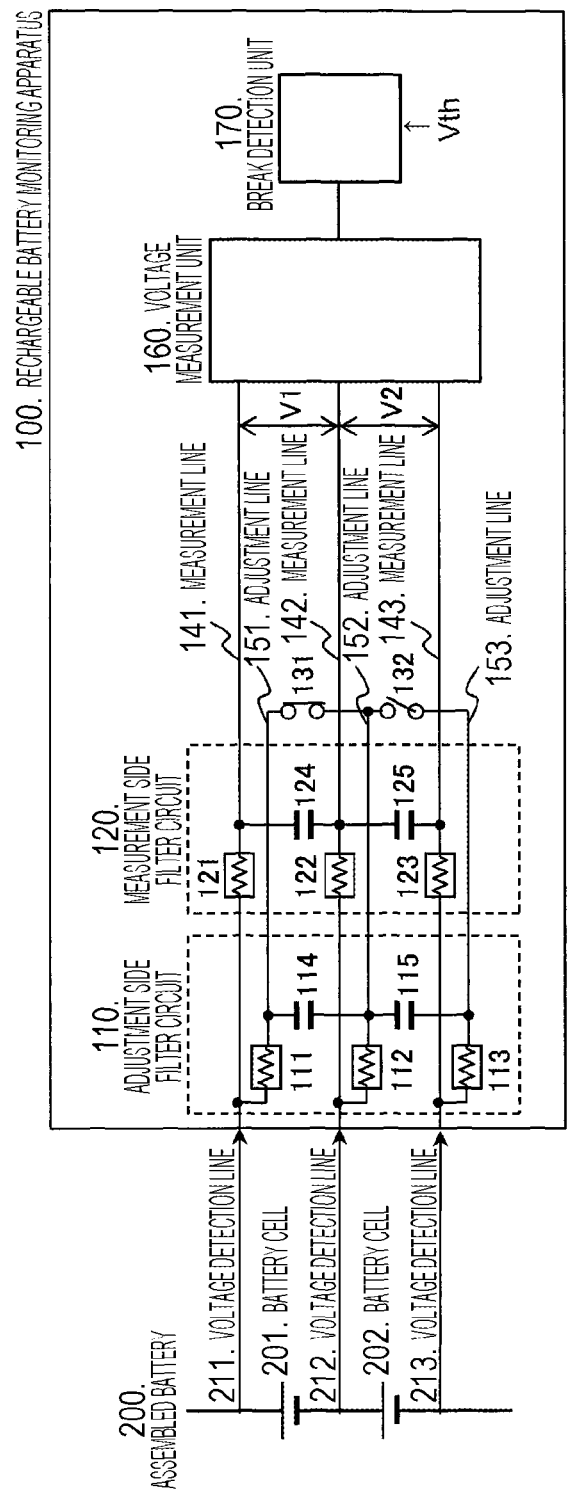
FIG. 1 is a diagram illustrating a configuration of a storage battery monitoring device 100 according to an embodiment of the present invention.

FIG. 1 is a diagram illustrating a configuration of a storage battery monitoring device 100 according to an embodiment of the present invention. The storage battery monitoring device 100 is connected to an assembled battery 200 via voltage detection lines 211, 212, 213.

The assembled battery 200 includes battery cells 201 and 202. Each of the battery cells 201 and 202 is a rechargeable battery configured using a secondary battery such as a lithium-ion battery. The battery cells 201 and 202 are discharged by supplying electric power to an unillustrated load. Moreover, the battery cells 201 and 202 can be charged using electric power supplied from an unillustrated charging device.

The voltage detection line 211 is connected to a positive electrode of the battery cell 201. The voltage detection line 212 is connected to a negative electrode of the battery cell 201 and a positive electrode of the battery cell 202. The voltage detection line 213 is connected to a negative electrode of the battery cell 202. In this manner, the voltage detection lines 211, 212, and 213 are connected to the positive and negative electrodes of the battery cells 201 and 202 that form the assembled battery 200.

The storage battery monitoring device 100 includes measurement lines 141, 142, and 143 and adjustment lines 151, 152, and 153, which are provided corresponding to the voltage detection line 211, 212, and 213, respectively, an adjustment side filter circuit 110, a measurement side filter circuit 120, a voltage measurement unit 160, and a break detection unit 170.

In the storage battery monitoring device 100, the measurement line 141 and the adjustment line 151 are connected in parallel to the voltage detection line 211. The measurement line 141 is connected to the voltage measurement unit 160. The adjustment line 151 is connected to a switch 131. The measurement line 142 and the adjustment line 152 are connected in parallel to the voltage detection line 212. The measurement line 142 is connected to the voltage measurement unit 160. The adjustment line 152 is connected to the switch 131 and a switch 132. The measurement line 143 and the adjustment line 153 are connected in parallel to the voltage detection line 213. The measurement line 143 is connected to the voltage measurement unit 160. The adjustment line 153 is connected to the switch 132.

The operations of the switches 131 and 132 are controlled by the voltage measurement unit 160. For example, the switches 131 and 132 are respectively closed to discharge the battery cells 201 and 202. Accordingly, balancing is performed on the charge capacities of the battery cells 201 and 202. Moreover, in a break detection process described below, an operation of alternately closing the switches 131 and 132 one by one and then opening them respectively after a lapse of a predetermined short-circuit time are performed.

The adjustment side filter circuit 110 is for removing noise flowing from the voltage detection lines 211, 212, and 213 into the adjustment lines 151, 152, and 153, and is configured using resistive elements 111, 112, and 113, and capacitive elements 114 and 115. As illustrated in FIG. 1, the resistive elements 111, 112, and 113 are respectively provided on the adjustment lines 151, 152, and 153. Moreover, the capacitive element 114 is provided between the adjustment lines 151 and 152. The capacitive element 115 is provided between the adjustment lines 152 and 153.

The measurement side filter circuit 120 is for removing noise flowing from the voltage detection lines 211, 212, and 213 into the measurement lines 141, 142, and 143, and is configured using resistive elements 121, 122, and 123, and capacitive elements 124 and 125. As illustrated in FIG. 1, the resistive elements 121, 122, and 123 are respectively provided on the measurement lines 141, 142, and 143. Moreover, the capacitive element 124 is provided between the measurement lines 141 and 142. The capacitive element 125 is provided between the measurement lines 142 and 143.

The voltage measurement unit 160 controls the operations of the switches 131 and 132, and also measures a voltage V1 between the measurement lines 141 and 142, and a voltage V2 between the measurement lines 142 and 143. In the break detection process, the voltage measurement unit 160 closes and opens the switches 131 and 132 alternately, and then measures the voltages V1 and V2. The measured voltages V1 and V2 are output to the break detection unit 170.

The measurement results of the voltages V1 and V2 from the voltage measurement unit 160 are input into the break detection unit 170. The break detection unit 170 compares them with a predetermined threshold voltage Vth. Breaks in the voltage detection lines 211, 212, and 213 are detected based on the comparison results.

FIG. 1 illustrates by example the configuration of the storage battery monitoring device 100 connected to the assembled battery 200 including the two battery cells 201 and 202. However, the number of battery cells of the assembled battery connected to the storage battery monitoring device according to the present invention is not limited to the example of FIG. 1. In the storage battery monitoring device according to the present invention, the voltage detection lines are respectively connected to the positive and negative electrodes of each battery cell irrespective of the number of battery cells configuring rechargeable batteries targeted for monitoring as illustrated in FIG. 1, and each voltage detection line is connected to the measurement line and the adjustment line. Furthermore, the filter circuit being a combination of a resistive element and a capacitive element is provided to each measurement line and to each adjustment line. A switch is also provided between adjacent adjustment lines.

Next, a description is given of the break detection process executed by the storage battery monitoring device 100. The storage battery monitoring device 100 executes the break detection process for detecting breaks in the voltage detection lines 211, 212, and 213 at a predetermined timing or on an instruction from the outside. In the break detection process, as described above, the voltage measurement unit 160 closes the switches 131 and 132 one by one and then opens them respectively after the lapse of the predetermined short-circuit time, and subsequently measures the voltage V1 between the measurement lines 141 and 142, and the voltage V2 between the measurement lines 142 and 143. The break detection unit 170 judges whether or not the voltage detection lines 211, 212, and 213 are broken, based on the voltages V1 and V2 measured in this manner.

Figure 2:
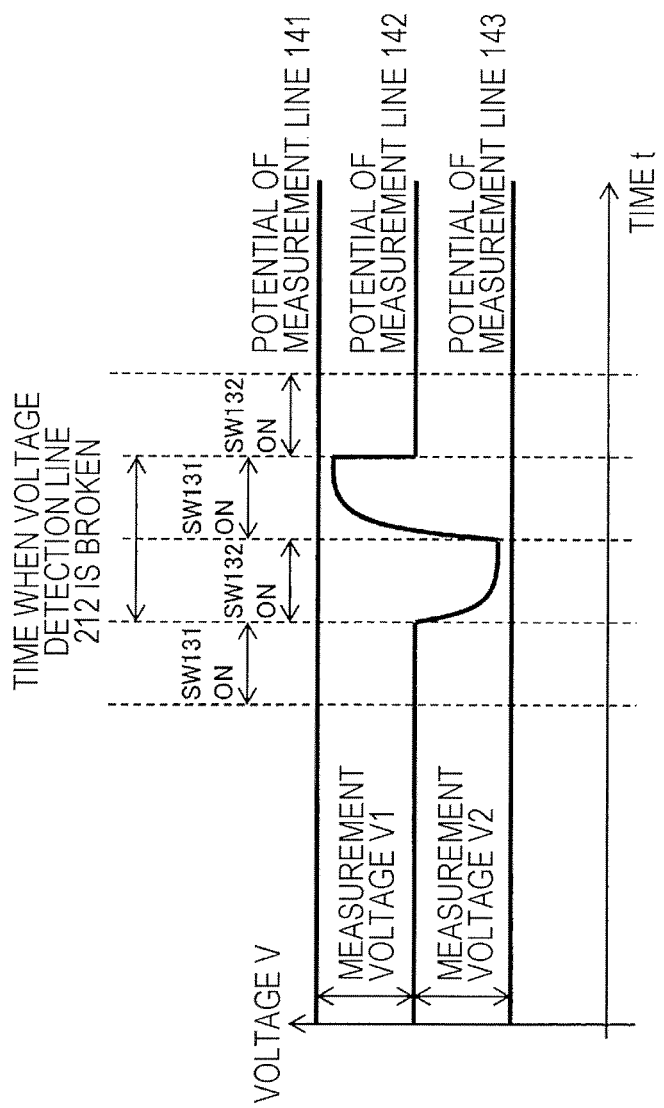
FIG. 2 is a diagram illustrating an example of changes of the potential of a measurement line 142 in a break detection process.

FIG. 2 is a diagram illustrating an example of changes of the potential of the measurement line 142 in the break detection process.

When the break detection process starts, the switches 131 and 132 are alternately switched to the on state. As illustrated in FIG. 2, it is assumed that the voltage detection line 212 is broken between the first time when the switch 132 is switched to the on state and the next time when the switch 132 is switched to the on state.

In this case, when the switch 132 is switched to the on state, the capacitive element 125 between the measurement lines 142 and 143 is discharged to gradually reduce the potential of the measurement line 142. At this point in time, in the voltage measurement unit 160, the measurement voltage V1 increases while the measurement voltage V2 decreases.

When the switch 131 is subsequently switched to the on state, current is supplied from the battery cell 201 via the voltage detection line 211 to charge the capacitive element 125 between the measurement lines 142 and 143. As a result, the potential of the measurement line 142 increases up to around the potential of the measurement line 141. At this point in time, in the voltage measurement unit 160, the measurement voltage V1 decreases while the measurement voltage V2 increases.

Furthermore, when the switch 132 is then switched to the on state with the unbroken voltage detection line 212, the potential of the measurement line 142 is returned to a potential in accordance with the positive electrode of the battery cell 202 and the negative electrode of the battery cell 201, which are connected via the voltage detection line 212. At this point in time, in the voltage measurement unit 160, the measurement voltages V1 and V2 become voltages under normal operating conditions.

As described above, if the voltage detection line 212 is broken, the measurement voltages V1 and V2 decrease respectively in accordance with the switching operations of the switches 131 and 132. Therefore, in the break detection unit 170, each of the measurement voltages V1 and V2 is compared with the predetermined threshold voltage Vth to determine whether or not the measurement voltages V1 and V2 are less than the predetermined threshold voltage Vth. Accordingly, a break in the voltage detection line 212 can be detected. Also if the other voltage detection lines 211 and 213 are broken, the breaks can be detected by a similar method.

Figure 3:
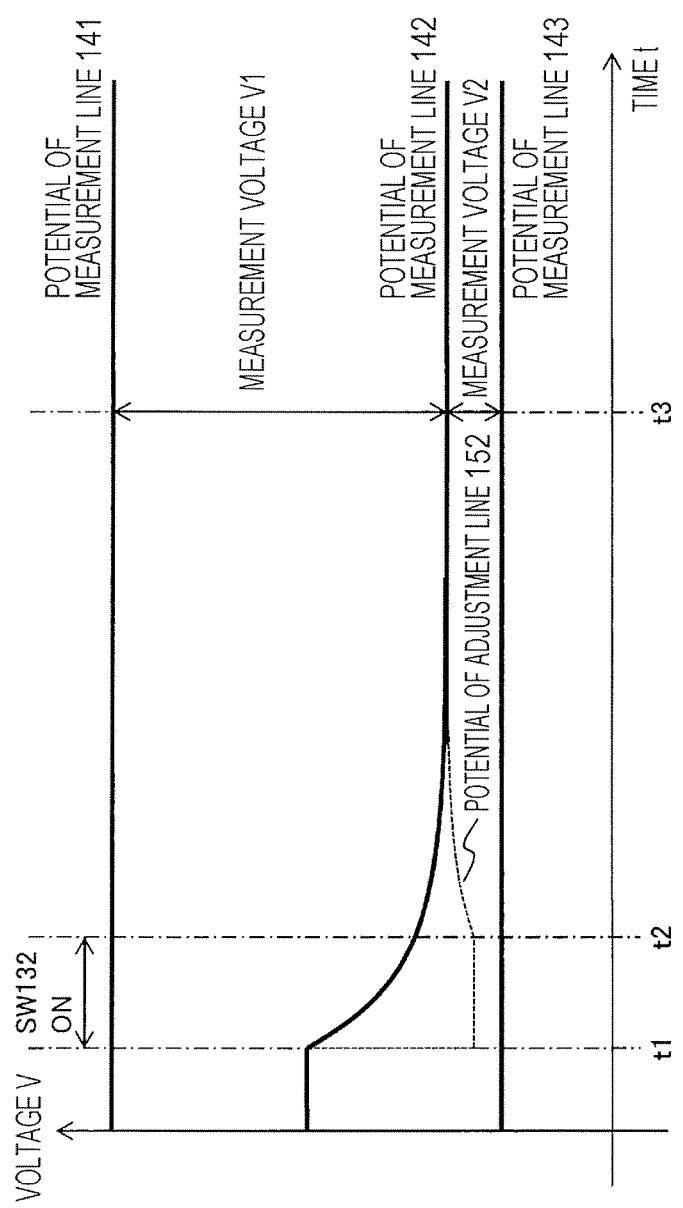
FIG. 3 is a diagram illustrating the details showing changes of the potential of the measurement line 142 of when a switch 132 is switched to the on state if a voltage detection line 212 is broken.

FIG. 3 is a diagram illustrating the details showing changes of the potential of the measurement line 142 of when the switch 132 is switched to the on state if the voltage detection line 212 is broken.

When the switch 132 is switched from the off state to the on state at time t1, the capacitive element 125 between the measurement lines 142 and 143 starts being discharged and also the capacitive element 115 between the adjustment lines 152 and 153 starts being discharged. At this point in time, the capacitive element 115 is coupled directly to the switch 132 not via a resistive element, and accordingly is discharged in a short time. On the other hand, the capacitive element 125 is coupled to the switch 132 via the resistive elements 122 and 123 provided to the measurement lines 142 and 143, and the resistive elements 112 and 113 provided to the adjustment lines 152 and 153, and accordingly is discharged later than the capacitive element 115. Hence, as illustrated in FIG. 3, the potential of the adjustment line 152 is reduced first and then the potential of the measurement line 142 is reduced later.

As illustrated in FIG. 3, it is assumed that the switch 132 is switched from the on state to the off state at time t2 when the discharge of the capacitive element 125 is not complete yet and the potential of the measurement line 142 is still decreasing. In this case, electrical charge is moved from the capacitive element 125 to the already discharged capacitive element 115. Accordingly, the capacitive element 125 continues being discharged while the capacitive element 115 is charged. Hence, the potential of the measurement line 142 continues decreasing, and the potential of the adjustment line 152 starts increasing.

When the potential of the measurement line 142 agrees with the potential of the adjustment line 152, the discharge of the capacitive element 125 and the charge of the capacitive element 115 are complete. Later at time t3, the voltage measurement unit 160 acquires the potential difference between the measurement lines 142 and 143 as the measurement voltage V2. Accordingly, the break in the voltage detection line 212 can be detected based on the measurement voltage V2.

The capacitance values of the capacitive elements 125 and 115 are respectively set to appropriate values. Accordingly, as described above, the capacitive element 125 can continue being discharged even after the switch 132 is switched from the on state to the off state. Consequently, as compared to a known method where the switch 132 is turned off after the discharge of the capacitive element 125 has been completed, the short-circuit time of the switch 132 can be reduced. Hence, a loss of power caused when the switch 132 is in the on state can be reduced.

Figure 4:
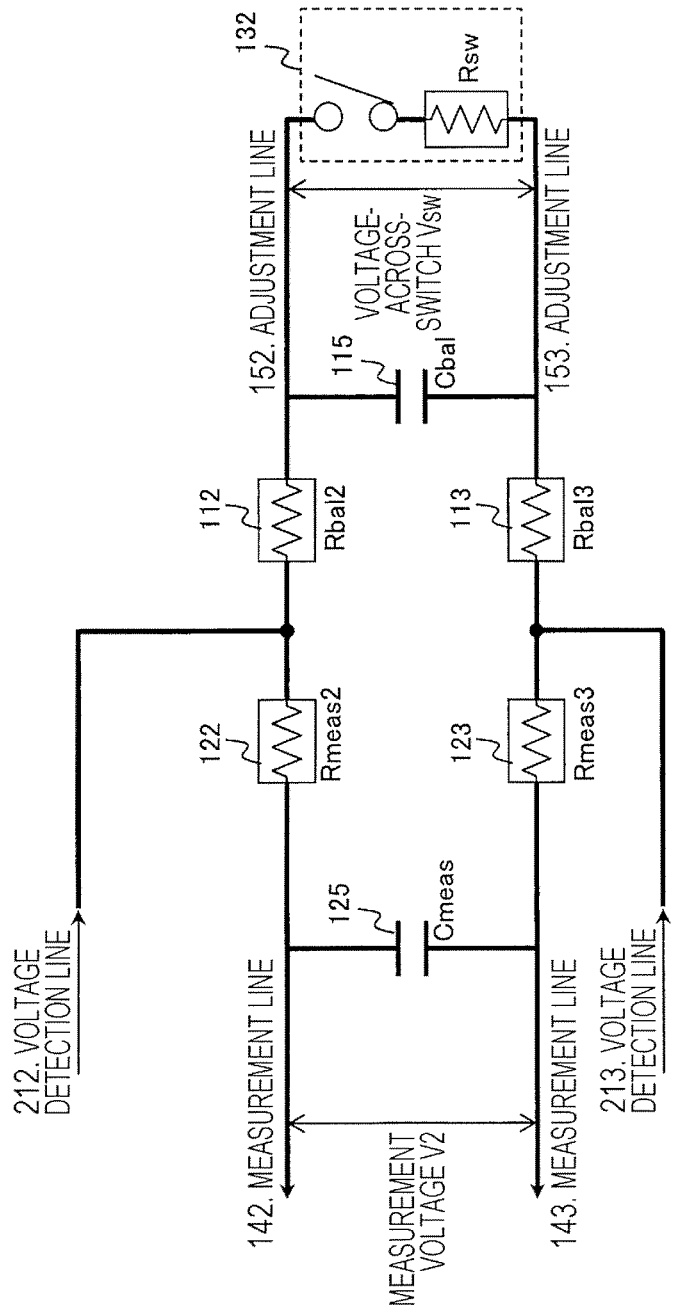
FIG. 4 is a diagram illustrating a circuit configuration of a portion related to the changes of voltage upon the voltage detection line 212 being broken.

Next, a description is given of a method for setting the capacitance values of the capacitive elements 125 and 115. FIG. 4 is a diagram illustrating a circuit configuration of a portion related to the changes of voltage upon the voltage detection line 212 being broken, within the configuration of FIG. 1.

As illustrated in FIG. 4, the switch 132 has an internal resistance. Rsw represents the value of the internal resistance. Moreover, a voltage-across-switch Vsw represents the voltage across the switch 132, that is, the voltage between the adjustment lines 152 and 153.

When the voltage detection line 212 is not broken, a voltage in accordance with the state of charge of the battery cell 202 is applied by the battery cell 202 of FIG. 1 between the measurement lines 142 and 143 and between the adjustment lines 152 and 153, via the voltage detection lines 212 and 213. An initial voltage V0 represents this voltage below.

When the voltage detection line 212 is broken, if the switch 132 is switched to the on state, the capacitive elements 125 and 115 both start being discharged as described above. When an elapsed time since the switch 132 is turned on be t, setting the elapsed time t as a variable, a time function V2(t) of the measurement voltage V2 and a time function Vsw(t) of the voltage-across-switch Vsw are respectively expressed by the following equations (1) and (2).

$$V2(t) = V0 * \exp(-t/\tau m) \quad (1)$$

$$Vsw(t) = V0 * \exp(-t/\tau b) \quad (2)$$

In equation (1), τm is a discharge time constant of the capacitive element 125, and can be expressed by the following equation (3). In equation (3), Rmeas2 and Rmeas3 respectively represent resistance values of the resistive elements 122 and 123. Rbal2 and Rbal3 respectively represent the resistance values of the resistive elements 112 and 113. Cmeas represents the capacitance value of the capacitive element 125.

$$\tau m = (Rmeas2 + Rbal2 + Rsw + Rbal3 + Rmeas3) * Cmeas \quad (3)$$

Moreover, in equation (2), τb is a discharge time constant of the capacitive element 115, and can be expressed by the following equation (4). In equation (4), Cbal represents the capacitance value of the capacitive element 115.

$$\tau b = Rsw * Cbal \quad (4)$$

In the above equations (3) and (4), generally, Rmeas2, Rmeas3, Rbal2, Rbal3 >> Rsw. Hence, it is found that τm >> τb when the capacitance value Cmeas of the capacitive element 125 and the capacitance value Cbal of the capacitive element 115 are substantially equal.

In equation (2), the time required to discharge the capacitive element 115 and reduce the voltage-across-switch Vsw to approximately 0 V is generally approximately five times as long as the discharge time constant τb expressed by equation (4). On the other hand, the time approximately five times as long as the discharge time constant τm expressed by equation (3) is required to discharge the capacitive element 125 and reduce the measurement voltage V2 to approximately 0 V. However, as described above, τm >> τb. Therefore, as described in FIG. 3, after the discharge of the capacitive element 115 has been completed, the switch 132 is turned off during the discharge of the capacitive element 125 to continue the discharge. Accordingly, as compared to the case where, as in before, the switch 132 is turned off after the discharge of the capacitive element 125 has been completed, it is found that the short-circuit time of the switch 132 can be greatly reduced.

As described above, when the switch 132 is turned off during the discharge of the capacitive element 125, and a sufficient time passes afterward, the potential of the measurement line 142 agrees with the potential of the adjustment line 152 to enter a steady state. The magnitude of the measurement voltage V2 in the steady state changes according to the initial voltage V0 and the short-circuit time of the switch 132. When the maximum value that the measurement voltage V2 can take in the steady state be V2st, the maximum value V2st can be obtained by the following equation (5). In equation (5), Vmax represents the maximum value of the initial voltage V0, in other words, the maximum value between the measurement lines 142 and 143 of when the voltage detection line 212 is not broken.

$$V2st = Vmax * Cmeas/(Cbal + Cmeas) \quad (5)$$

When the maximum value V2st of the measurement voltage V2 expressed by the above equation (5) falls below the above-mentioned threshold voltage Vth, the break detection unit 170 can appropriately detect a break in the voltage detection line 212. Therefore, the capacitance value Cmeas of the capacitive element 125 and the capacitance value Cbal of the capacitive element 115 are set in such a manner as to satisfy the following inequality (6). Accordingly, the break in the voltage detection line 212 can be detected using the method described in FIG. 3.

$$Cmeas/(Cbal + Cmeas) < Vth/Vmax \quad (6)$$

Generally, the threshold voltage Vth is set to a lower value than the overdischarge voltage of the battery cell 202. Therefore, for example, if the overdischarge voltage of the battery cell 202 is 2 V, and Vmax=5 V, the capacitance value Cmeas of the capacitive element 125 and the capacitance value Cbal of the capacitive element 115 are set in accordance with the threshold voltage Vth within a range that satisfies at least the relation of Cbal>1.5*Cmeas. For example, if Vth=0.5 V and Vmax=5 V, Cbal>9*Cmeas. Accordingly, the relation of inequality (6) can be satisfied.

In the above description, an example of the case where the voltage detection line 212 is broken has been described. However, the same applies to cases where the other voltage detection lines 211 and 213 are broken. In other words, the capacitance values of the capacitive elements 114 and 124 are set as in the above capacitive elements 115 and 125. Accordingly, it is possible to reduce the short-circuit time of the switches 131 and 132 and reduce a loss of power also in the detection of breaks in the voltage detection lines 211 and 213. Furthermore, the measurement line and the adjustment line are connected to each voltage detection line connected to each battery cell irrespective of the number of battery cells, and the capacitance value of the capacitive element configuring the filter circuit of each of the measurement line and the adjustment line is set as described above. Accordingly, it is possible to reduce a loss of power in the detection of a break in each voltage detection line.

The above-described embodiment exhibits the following operations and effects.

(1) The storage battery monitoring device 100 includes a pair of the measurement lines 142 and 143 connected respectively to a pair of the voltage detection lines 212 and 213 connected respectively to the positive and negative electrodes of the battery cell 202 being a rechargeable battery, a pair of the adjustment lines 152 and 153 connected respectively to the voltage detection lines 212 and 213 in parallel with the measurement lines 142 and 143, the capacitive element 125 connected between the measurement lines 142 and 143, the capacitive element 115 connected between the adjustment lines 152 and 153, and the switch 132 connected across the capacitive element 115. In this circuit configuration, the capacitance value Cmeas of the capacitive element 125 and the capacitance value Cbal of the capacitive element 115 are set in such a manner as that the measurement voltage V2 between the measurement lines 142 and 143 continues changing after closing the switch 132 and then opening it after the lapse of the predetermined short-circuit time if the voltage detection line 212 is broken. Consequently, it is possible to reduce a short-circuit time required to detect connection failure of the voltage detection line 212, and reduce a loss of power.

(2) The capacitance value Cmeas of the capacitive element 125 and the capacitance value Cbal of the capacitive element 115 are set in such a manner as to satisfy the above-mentioned inequality (6), based on the maximum voltage Vmax between the measurement lines 142 and 143 of when the voltage detection line 212 is not broken, and the predetermined threshold voltage Vth for detecting a break in the voltage detection line 212. Consequently, if the voltage detection line 212 is broken, the measurement voltage V2 between the measurement lines 142 and 143 can continue changing until falling below the threshold voltage Vth, after the switch 132 is closed and then opened after the lapse of the predetermined short-circuit time. Therefore, the break in the voltage detection line 212 can be reliably detected.

(3) The storage battery monitoring device 100 includes the voltage measurement unit 160 that measures the voltage V1 between the measurement lines 141 and 142, and the voltage V2 between the measurement lines 142 and 143 after closing the switches 131 and 132 and then opening them after the lapse of the short-circuit time, and the break detection unit 170 that compares the voltages V1 and V2 measured by the voltage measurement unit 160 with the threshold voltage Vth, and detects breaks in the voltage detection lines 211, 212, and 213 based on the comparison results. Consequently, if the voltage detection lines 211, 212, and 213 are broken, the breaks can be reliably detected.

The above-described embodiment and modifications are merely examples. The present invention is not limited to the contents of them unless the features of the invention are not impaired.

REFERENCE SIGNS LIST 100 storage battery monitoring device
110 adjustment side filter circuit
111, 112, 113 resistive element
114, 115 capacitive element
120 measurement side filter circuit
121, 122, 123 resistive element
124, 125 capacitive element
131, 132 switch
141, 142, 143 measurement line
151, 152, 153 adjustment line
160 voltage measurement unit
170 break detection unit
200 assembled battery
201, 202 battery cell
211, 212, 213 voltage detection line

The invention claimed is:
1. A storage battery monitoring device comprising:
a pair of measurement lines connected respectively to a pair of voltage detection lines connected respectively to a positive and a negative electrode of a rechargeable battery such that a maximum voltage Vmax is defined between the pair of measurement lines when the voltage detection lines are not broken;
a pair of adjustment lines connected respectively to the pair of voltage detection lines in parallel with the measurement lines;
a first capacitive element connected between the pair of measurement lines;
a second capacitive element connected between the pair of adjustment lines;
a switch connected across the second capacitive element;
a voltage measurement unit which measures a voltage between the pair of measurement lines after closing the switch and opening the switch after the lapse of a predetermined short-circuit time; and a break detection unit which compares the voltage measured by the voltage measurement unit with a threshold voltage Vth, and detects a break in the voltage detection line based on the comparison result;

wherein a capacitance values Cmeas of the first capacitive element and a capacitance value Cbal of the second capacitive elements are set based on the maximum voltage Vmax and the predetermined threshold voltage Vth for detecting a break in the voltage detection line such that Cmeas/(Cbal+Cmeas)<Vth/Vmax and such that a voltage between the pair of measurement lines continues changing after closing the switch and then opening the switch after a lapse of the predetermined short-circuit time upon the voltage detection line being broken.

* * * * *